US006674309B1

(12) United States Patent
Mercer et al.

(10) Patent No.: US 6,674,309 B1
(45) Date of Patent: Jan. 6, 2004

(54) DIFFERENTIAL TIME SAMPLING CIRCUIT

(75) Inventors: Douglas A. Mercer, Bradford, MA (US); Michael P. Timko, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/292,114

(22) Filed: Nov. 12, 2002

(51) Int. Cl.[7] .......................... G01R 25/00; G11C 27/02
(52) U.S. Cl. .............................................. 327/9; 327/94
(58) Field of Search .............................. 327/2, 3, 9, 33, 327/45, 91, 94, 147–149, 156–158; 341/122

(56) References Cited

U.S. PATENT DOCUMENTS

| | | | | |
|---|---|---|---|---|
| 3,723,982 A | * | 3/1973 | Frazier, Jr. ................... | 360/18 |
| 3,996,422 A | * | 12/1976 | Eixenberger ................ | 370/229 |
| 4,047,819 A | * | 9/1977 | Goldberg .................... | 356/434 |
| 5,530,383 A | * | 6/1996 | May ............................ | 327/39 |
| 6,072,336 A | * | 6/2000 | Yamaguchi .................. | 327/12 |

OTHER PUBLICATIONS

O. Chen et al., "A Power–Efficient Wide–Range Phase-Locked Loop," *IEEE Journal of Solid–State Circuits*, vol. 37, No. 1, Jan. 2002, pp. 51–62.
W. Evans et al., "Characterisation of a phase–sensitive detector," *IEE Proceedings*, vol. 136, Pt. G., No. 5, Oct. 1989, pp. 285–292.
D. Foley et al., "CMOS DLL–Based 2–V 3.2–ps Jitter 1–GHz Clock Synthesizer and Temperature–Compensated Tunable Oscillator," *IEEE Journal of Solid–State Circuits*, vol. 36, No. 3, Mar. 2001, pp. 417–423.
A. Hati et al., "Phase detector for data–clock recovery circuit," *Electronics Letters*, vol. 38, No. 4, Feb. 14, 2002, pp. 161–163.
K. Minami et al., A 1GHz Portable Digital Delay–Locked Loop with Infinite Phase Capture Ranges, 2000 IEEE International Solid–State Circuits Conference, Session 21, paper WA 21.2, pp. 350–351 and 469.
D. Santos et al., "A CMOS Delay Locked Loop and Sub-Nanosecond Time–to–Digital Converter Chip," 1996, pp 289–291.
D. Vyroubal, "Frequency Insensitive Phase Detector with Fast Response and Very Low Output Ripple," *IEEE Transactions on Instrumentation and Measurement*, vol. 49, No. 5, Oct. 2000, pp. 1077–1082.
I. Zhou et al., "A 1GHz 1.8V Monolithic CMOS PLL with Improved Locking," 2001 IEEE, pp. 458–461.

* cited by examiner

*Primary Examiner*—My-Trang Nu Ton
(74) *Attorney, Agent, or Firm*—Wolf, Greenfield & Sacks, P.C.

(57) ABSTRACT

A method and apparatus for measuring and controlling the phase difference or time difference between two signals is presented. In some embodiments two sample and hold (S/H) circuits are arranged as a cooperating system that alternately samples a first signal using the second as a reference. Chopping may be used at the input or output of the S/H circuits. In some embodiments, accurate measurement of digital signal phase differences, such as between two square waves, is obtained without the problems associated with traditional pulse-generation techniques that fail at high frequencies and short pulse lengths.

22 Claims, 13 Drawing Sheets

DIFFERENTIAL TIME SAMPLING CIRCUIT

TECHNICAL FIELD

The present invention relates to detection and control of time or phase differences between electronic signals, such as in delay locked loops.

BACKGROUND

Delay locked loops (DLLs), particularly of the recirculating type, use clock multiplication and require close alignment between two edges of signals (e.g., clock signals) whose relative phases are being measured or controlled. Digital phase detectors and phase sensitive detectors (PSDs) are known, and are commonly built from exclusive-OR (XOR) logic gates and flip flops (FFs). Other common circuits are phase/frequency detectors, normally made from NAND gate-implemented R-S flip-flops.

Some circuits require very close time alignment between various edges of signals propagating through the circuits. The term "edge" is used to describe the transition between two states of a signal. For example, a rising edge is a transition from a low state to a high state, while a falling edge is a transition from a high state to a low state of a signal. Many types of circuits, including data processing and signal processing circuits, use signals which transition between high and low states, sometimes designating two states of a binary system. Clock circuits produce signals which oscillate periodically between a high state and a low state, the periodicity of which defines the frequency of oscillation of the clock.

It is sometimes desired to measure a relative phase difference or time difference between two signals, such as square waves or other signals containing rising and falling edges. Existing methods are typically digital in nature, and include phase detectors and phase/frequency detector circuits, as mentioned briefly above.

One technique for measuring the phase difference between two sine waves involves multiplying the two sine waves. The multiplied signal comprises a DC component that indicates the phase difference. Such solutions work reasonably well for sinusoidal signals, but not so well for other types of signals, such as square waves. Furthermore, these techniques require filtering out the sinusoidal components to obtain the DC signal. Other problems with these techniques include difficulty in determining the actual peaks of the signals, and the possibility of obtaining false locks if the wrong zero of two possible zeros is detected in the process of determining the phase difference.

Other techniques including the use of sample-and-hold (S/H) circuits have been applied to the situation where one signal is a square wave and the other signal is not a square wave, but is a known wave. These techniques require additional processing of the two signals and are not efficient.

Some previous techniques attempted to measure phase differences between two square waves by generating a pulse whose width is equal to the difference in time between the two measured edges. This technique has limitations, especially in fast circuits, as the generated pulse width becomes too narrow. Since pulse rise and fall times are finite, the pulse itself may begin to disappear when the pulse's rising and falling edges occur close enough to each other so that the pulse is not properly formed.

Foley discloses a technique for detecting both frequency and phase difference (IEEE J. Solid State Circuits, March 2001). Evans discloses a track-and-hold (T/H) circuit as a phase-sensitive detector (IEEE Proceedings, October 1989). Vyroubal (IEEE Trans. Inst. Meas., October 2000) discloses two sinusoidal inputs generating a pulse which must be wider than the combined rise and fall time of the pulse. This approach suffers from the "dead band" problem if the pulse width becomes too small.

Thus, a need exists to measure and detect a phase difference between two square waves and other types of signals. Merely applying the sample-and-hold digital techniques is not very effective in this situation, as it is difficult to determine the individual delays affecting each of the more than one signals being compared, sometimes referred to as "aperture delay." Furthermore, for fast switching signals, there is an "aperture window" wherein a sample-and-hold switch is neither open nor closed. This situation can lead to errors in the sampled data or to a complete inability to measure very small phase differences, as will be discussed below.

SUMMARY

Various embodiments of the present invention are described in more detail below, and solve at least the problems described in the Background section above.

Accordingly, some embodiments of the present invention are directed to a differential sampling circuit, comprising a commutator having at least two inputs that receive a respective first input signal and a second input signal, said commutator having at least a first output and a second output, the first commutator output alternately providing said first and second input signals and the second commutator output alternately providing said second and first input signals, respectively; a sample-and-hold circuit that alternately samples the second commutator output using the first commutator output as a reference, and samples the first commutator output using the second commutator output as a reference, and that provides an interleaved error signal; and a decommutator that receives said interleaved error signal and provides at least two de-interleaved output signals indicative of a time difference between said first and second input signals.

In some aspects, the first and second input signals have matched characteristics, which sometimes may relate said time difference to a corresponding potential difference. The first and second input signals may also comprise digital input signals and/or square waves.

In other aspects, the commutator and the decommutator are complimentary and perform substantially inverse operations. Various embodiments are directed to circuits and systems wherein the decommutator comprises a multiplexer followed by a pair of sample-and-hold circuits each of which receives an output from the multiplexer.

Other embodiments of the above-mentioned circuit comprise a voltage-to-current converter that provides a current signal indicative of said time difference. Said circuits and systems may also comprise an integrator that integrates the current signal and provides an integrated signal. In addition, the circuits and systems may comprise a control circuit that receives the integrated signal and provides a control signal. The control circuit controls any of atidelay, a phase and a frequency of a controlled signal using said control signal according to some embodiments of the present invention. For example, the control circuit may comprise a voltage controlled oscillator.

Yet other embodiments are directed to a method for determining a time difference between at least a first input signal and a second input signal, comprising commutating the first and second input signals to alternately provide the first and second input signals at first and second commutator outputs; alternately sampling the first commutator output using the second commutator output as a reference and sampling the second commutator output using the first commutator output as a reference; generating an interleaved error signal from the first and second commutator outputs; and de-interleaving said error signal to provide at least two de-interleaved output signals indicative of a time difference between the first and second input signals.

The method may further comprise holding the sampled commutator outputs. The method may further comprise converting the de-interleaved output signals from a voltage to a current. According to some aspects, the method further comprises integrating said current to provide an integrated signal and/or generating a control signal from said integrated signal.

Aspects of the invention also comprise controlling a voltage controlled oscillator or a voltage controlled delay element using said control signal.

The embodiment mentioned above may also comprise, in the act of de-interleaving said error signal, multiplexing said error signal and providing a first multiplexed signal and a second multiplexed signal to respective first and second sampling circuits.

Further embodiments are directed to a differential sampling circuit, comprising an input network, said input network comprising a first input line and a second input line, each of said first and second input lines being cross-hard wired to provide a pair of respective first and second input signals; a first sampling circuit and a second sampling circuit, each of said first and second sampling circuits receiving said pair of first and second input signals from the cross-hard wired input lines, said first and second sampling circuits each providing an output voltage; and an error signal, corresponding to a phase difference between said first and second input signals, said error signal representing a potential difference between said first and second sampling circuit outputs. The error signal may correspond to a time delay between said first and second input signals in some embodiments.

BRIEF DESCRIPTION OF THE DRAWINGS

The present invention can be more fully understood from consideration of the following detailed description of illustrative embodiments thereof, and from consideration of the accompanying drawings in which.

DETAILED DESCRIPTION

Delay-Locked-Loops (DLLs), particularly of the recirculating type which are sometimes used for clock multiplication, require an edge of an input reference signal and an edge of a delayed version of the input signal to be aligned in time. The loop works to align the two edges in time by varying the amount of delay of one with respect to the other. As discussed previously, existing solutions to this problem were typically digital in nature and introduced offset and other errors, resulting in undesirable outcomes.

Some embodiments of the present invention use an analog sampling approach to measure the relative difference in time between two digital signals, or, to measure a relative phase difference or time delay between two signals. In some aspects the two signals are two square wave signals. For instance, two single-ended circuits are used to form a differential sampler to produce a voltage error signal output which is a measure of the difference in time between two input signals. This analog error voltage signal can be used to control another circuit or signal directly or indirectly, such as by converting the error voltage to an error current to achieve a useful result. In some embodiments, a voltage-to-current or V-I converter is used to produce a current that is integrated in a loop filter to provide a control voltage for a variable delay block in a DLL. Also, a voltage-controlled oscillator (VCO) can be controlled using the control voltage, optionally acting as a feedback system to control a circuit frequency or a signal's phase. Various aspects of the present invention allow for more accurate and simpler DLL designs. Other aspects lend themselves to the inclusion of chopper or commutator stabilization circuits to stabilize offset errors, as will be discussed below.

Figure 1:
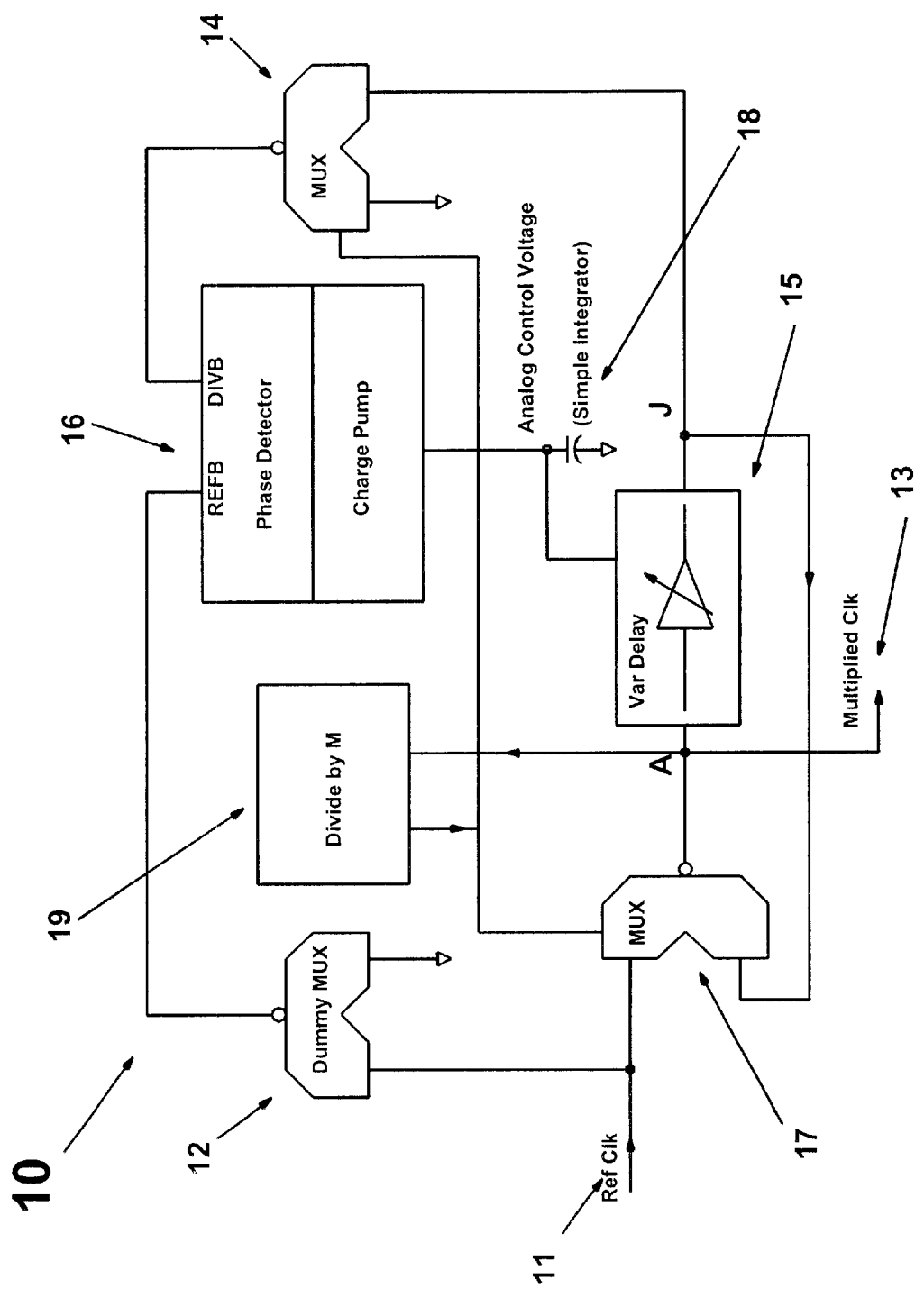
FIG. 1 illustrates a Delay-Locked-Loop clock multiplier.

FIG. 1 illustrates an embodiment of a Delay-Locked-Loop (DLL) 10 configured to multiply the frequency of a reference clock signal 11 by a factor M and yield a multiplied clock signal 13, provided at node A. A variable delay element 15 alternately receives either an inverted version of the reference clock signal 11 or its own output through multiplexer (MUX) 17. A ring osciallator is formed when MUX 17 is configured to pass the output J of variable delay element 15 back to its input. This ring oscillator will oscillate with a period equal to twice the delay through variable delay element 15. A counter 19 divides this oscillation by a factor of M and when a count of M cycles has occurred it returns MUX 17 to the condition where the inverted reference clock is applied to A. Inverted versions of the reference clock 11 and the Mth rising edge on delay line output J appear at the outputs of multiplexers 12 and 14 respectively. These two signals are further applied to the input of a combination phase detector and charge pump 16. The charge pump output current is integrated on a capacitor to form a simple integrator low pass filter 18. The voltage stored on the capacitor provides the controlling signal for the variable delay element 15.

Figure 2:
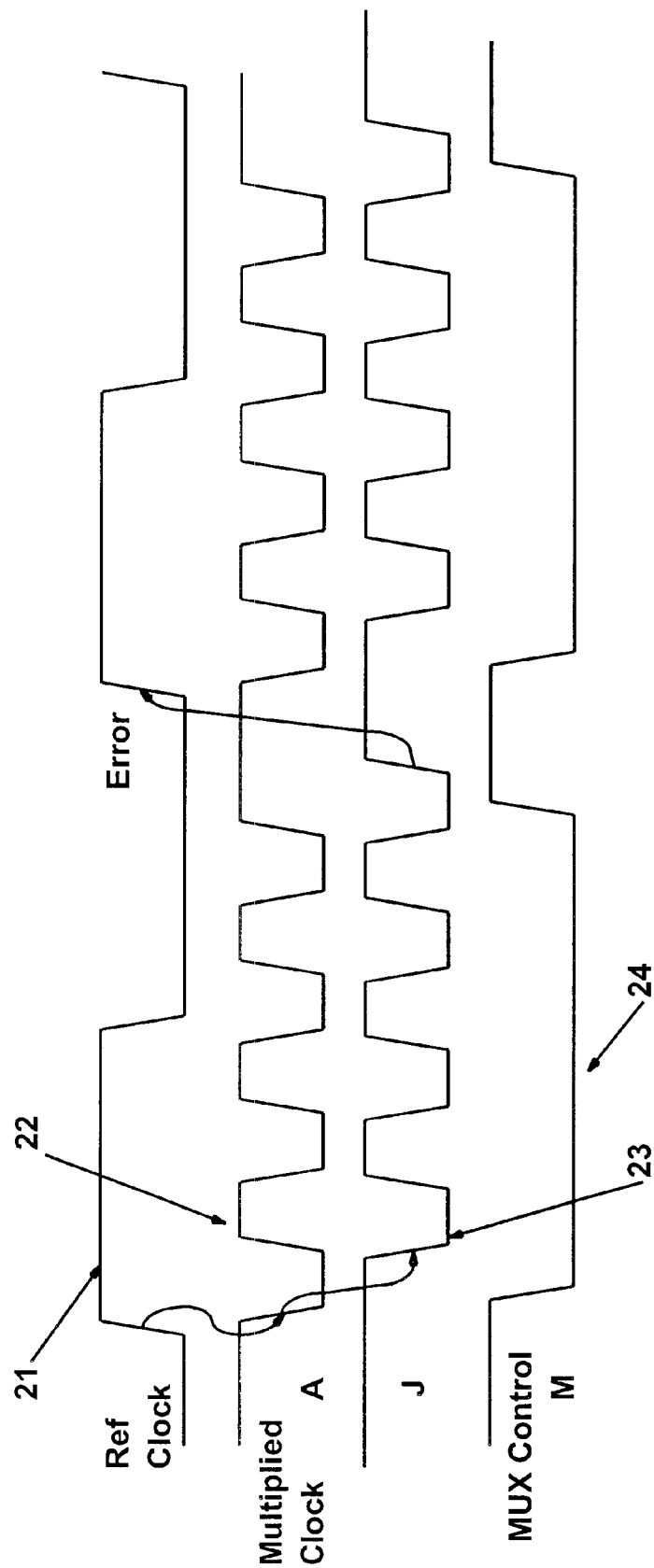
FIG. 2 illustrates a timing diagram showing key internal waveforms of FIG. 1.

FIG. 2 depicts exemplary signal waveforms of the DLL illustrated in FIG. 1. Waveform 21 represents the reference input clock signal 11. Signal 24 is a control signal that controls one or more multiplexers. At the start of a cycle it is assumed that MUX control signal 24 is in such a state to allow the reference input clock signal 11 to be applied to the input of variable delay element 15 of FIG. 1. A rising edge on signal 21 will result in a first falling edge on the multiplied clock output signal 22 in FIG. 2. After the delay time of the delay line this edge will appear as a first falling edge of signal 23 in FIG. 2. The first falling edge on, signal 22 also causes a change of state in MUX control signal 24 indicated by its first falling edge. Because the MUX control signal 24 is now low, MUX 17 is now configured to pass an inverted version of signal 23 in FIG. 2, to the input of the variable delay element 15. This is depicted as the first rising edge of signal 22. Again, after the delay of the delay line, this appears as the first rising edge of signal 23.

The edges continue to recirculate as described above for 4 cycles in this example (Divider 19 in FIG. 1 set to 4). After the 4th rising edge of signal 22, the MUX control signal 23 returns high to the condition where the reference clock is applied to the input of the variable delay element 15.

In the example of FIGS. 1 and 2, the delay time of the variable delay element 15 is set too short for the required 4 cycles to align exactly with the time between adjacent rising edges of the reference clock signal 21. The phase detector/charge pump 16 measures the difference in time between the rising edges of signal 21 and the Mth (or 4th in this example) edge of signal 23. Any difference causes the analog control voltage on 18 to increase or decrease causing the delay of variable delay element 15 to increase or decrease until such time difference is zero.

In certain applications, such as analog to digital (ADC) and digital to analog (DAC) converter sampling, it is very important that the edges of the multiplied clock output be precisely spaced in time. As can be seen from the waveforms in FIG, 2, errors in the phase detector/charge pump 16 will result, in this example, in 3 cycles with a shorter than ideal period and one cycle with a longer than ideal period.

Figure 3:
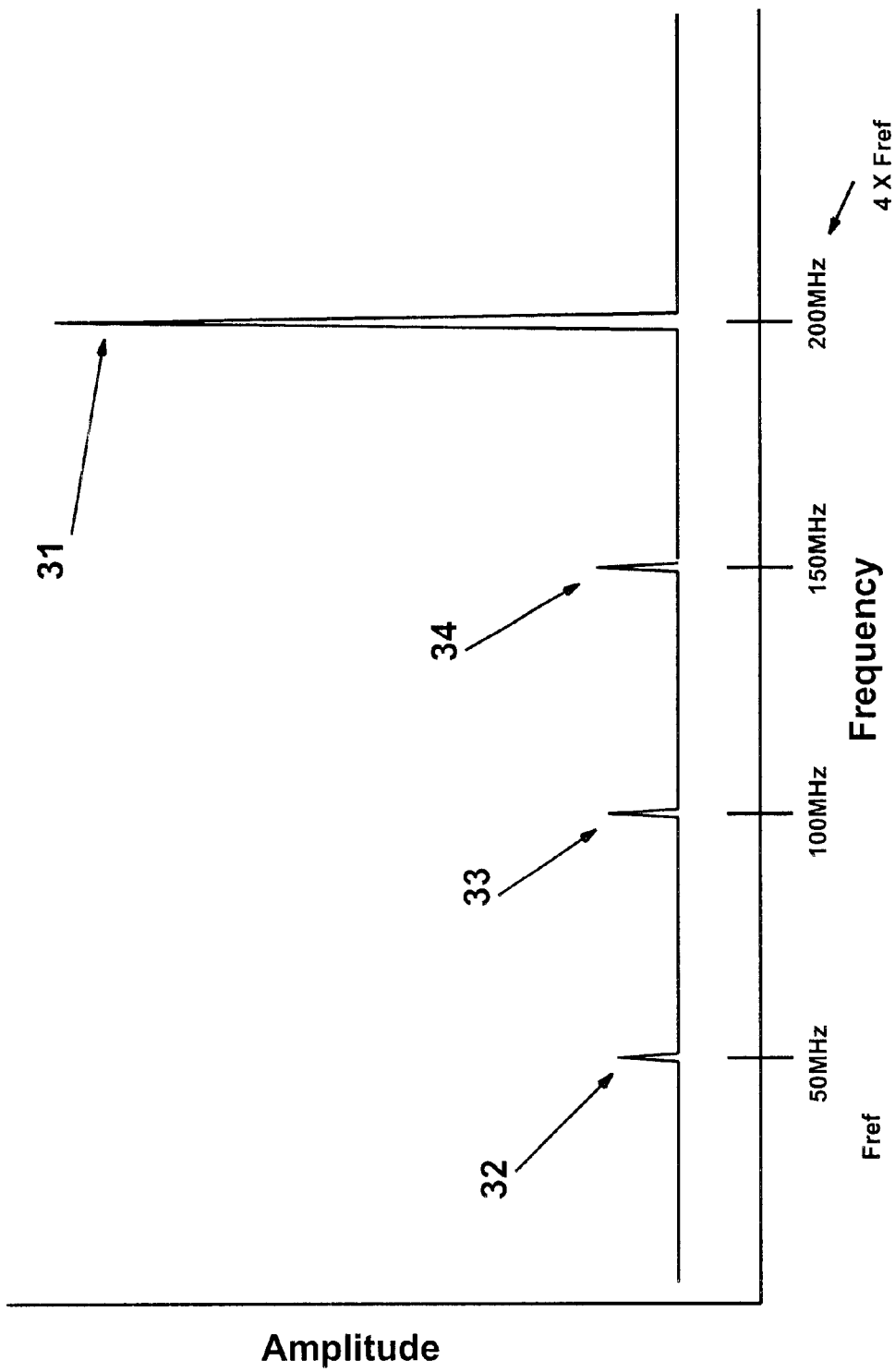
FIG. 3 illustrates a frequency spectrum of the multiplied clock output of FIG. 1.

In FIG. 3 this condition is shown in the frequency domain. The reference clock has a frequency of 50 MHz which is multiplied by a factor of 4 to yield a frequency of 200 MHz, the frequency spectrum of the output waveform 22 of FIG. 2 will contain a large amplitude component 31 at 200 MHz. However, due to the errors mentioned earlier, spurious signals at multiples of the lower reference clock 32, 33 and 34 appear in the spectrum as well. It is an object of one aspect of some embodiments described herein to minimize spurious components of the signal of FIG. 3.

Existing phase difference detectors and other digital circuits generally measure a phase difference between two input signals by generating a pulse and determining its width. The pulse's width being an indication of the phase difference between the two input signals.

Figure 4:
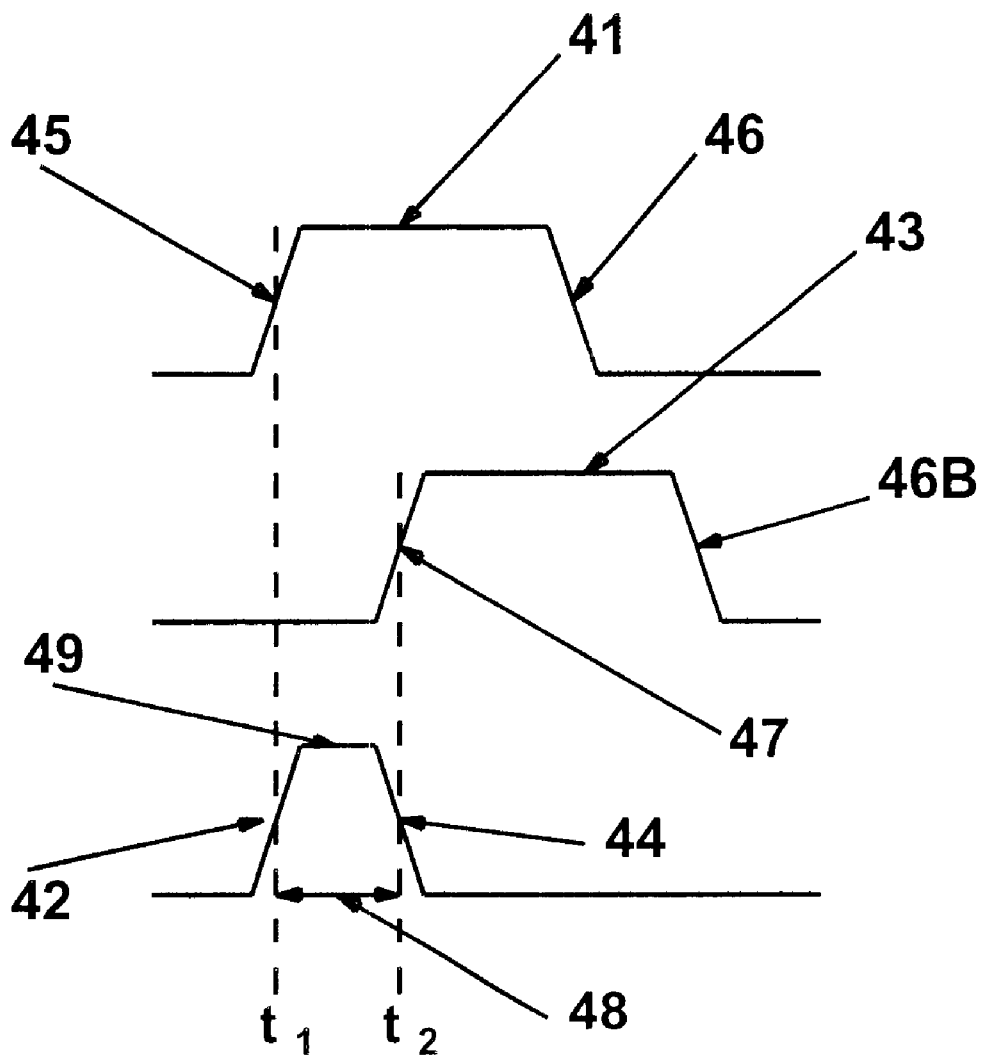
FIG. 4 illustrates a timing diagram showing time delay measurement using a generated pulse waveform.

FIG. 4 is a timing diagram illustrating two input signals 41 and 43. Signals 41 and 43 have rising edges 45 and 47 and falling edges 46 and 46B, respectively. The phase difference (or equivalently in some applications the time delay) between signals 41 and 43 is measured by the time difference between the occurrences of the rising edge 45 of signal 41 and the rising edge 47 of signal 43. In this example, rising edge 45 occurs at approximately time $t_1$ and rising edge 47 occurs at approximately time $t_2$. The reason that times are approximate is that each signal value transition (edge) requires a finite amount of time to occur. Thus, while many signals ideally experience rising and falling transitions in an infinitesimally-small time, in reality, the physics and design constraints of electronic devices preclude such instantaneous transitions. The rate at which a signal rises or falls during an edge transition is sometimes called the "edge rate."

The finite transition time for signals 41 and 43 can become a factor limiting the performance of some digital phase detector circuits that rely on pulse-width measurement. In one embodiment, a pulse signal 49 is created by generation of rising edge 42 on a rising edge 45 of signal 41, and by generation of a falling edge 44 on a rising edge 47 of signal 43. Hence the width of the pulse 49 is a measure of the time delay 48 between times $t_1$ and $t_2$ or between rising edges 45 and 47.

It can be seen from FIG. 4, which is not drawn to any scale but is given for illustrative purposes, that because the transitions 45 and 47 are of finite duration, the exact phase difference between signals 41 and 43 may be difficult to determine, especially if the actual signals have variable or inconsistent threshold points that actuate a timed event or act as a reference point for measuring said phase difference. The illustrated curves are only representative of the behavior discussed herein, and actual signals may contain noise and other irregularities.

The difficulty described above can become even more acute for high-speed circuits or for input signals that have a relatively small phase difference between the input signals. In these situations, the pulse width 48 becomes relatively small, and it is possible in some instances to experience a condition, sometimes called a "dead band" problem, where the rising edge 42 and the falling edge 44 of pulse signal 49 overlap, as will be described below.

Figure 5:
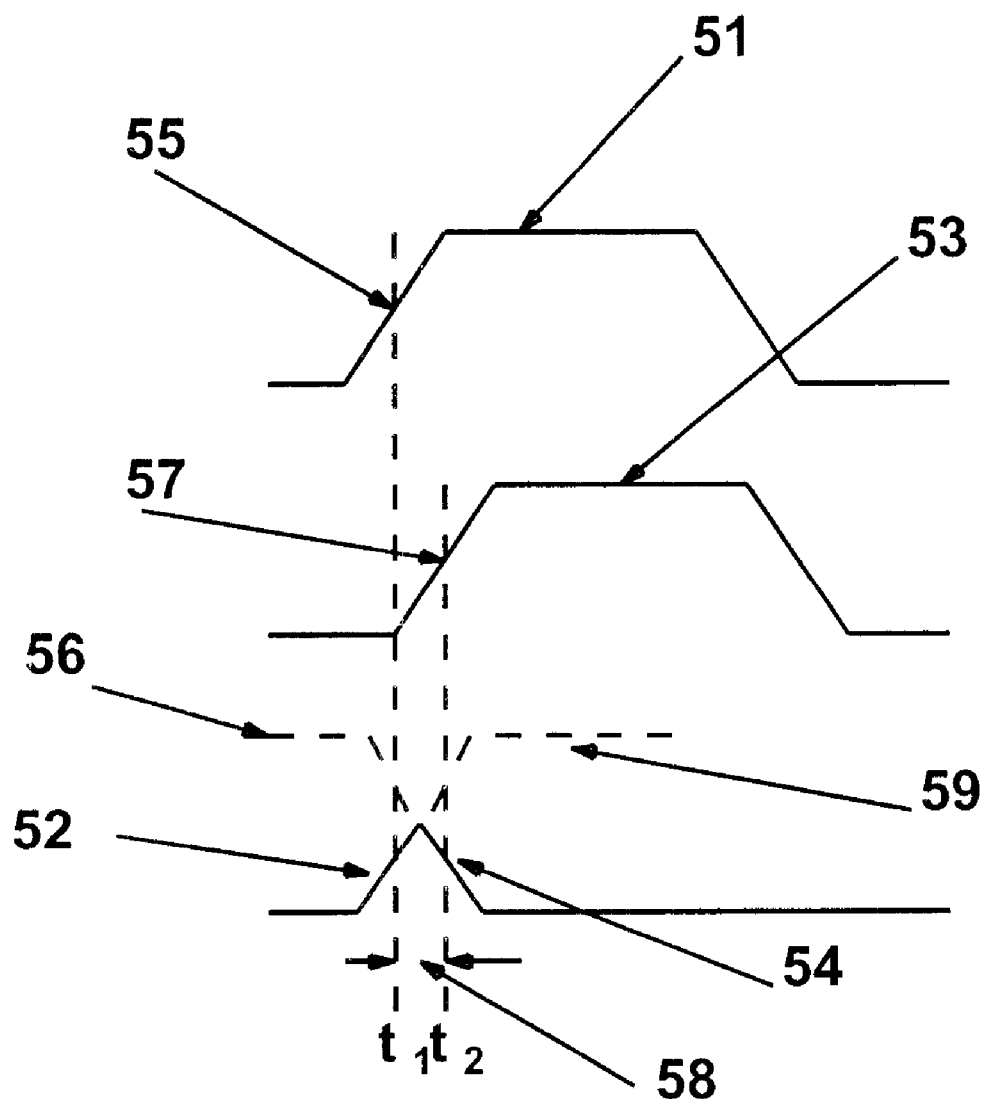
FIG. 5 illustrates a timing diagram wherein the generated pulse is too narrow to be fully formed.

FIG. 5 illustrates the so-called "dead band" condition. Rising edges 55 and 57 of the two input signals 51 and 53 are very closely phased. That is, times $t_1$ and $t_2$ are close to one another and are in fact more closely spaced than the finite rise time required to achieve a transition of signals 51 and 53. Here, a rising pulse transition 52 occurs, but before it can conclude (dashed line 59), the pulse experiences a falling transition 54, which falling transition also is shorter than a complete falling transition would require (dashed line 56). In this condition, no proper pulse (equivalent to pulse 49 of FIG. 4) was formed and thus no proper measurement of the phase difference between input signals 51 and 53 could be made.

To avoid the above-mentioned condition, it is useful to have a way to convert time differences into corresponding voltage differences, or into an output potential (referenced to a reference potential). According to some embodiments of the present invention, the difference in time between two input digital signals is converted to an analog voltage. This analog voltage difference can then be used to produce an error signal that is indicative of the time difference. Furthermore, the error signal can be converted to an error current which may be integrated in a loop filter and used to perform various measurement and control functions.

Figure 6:
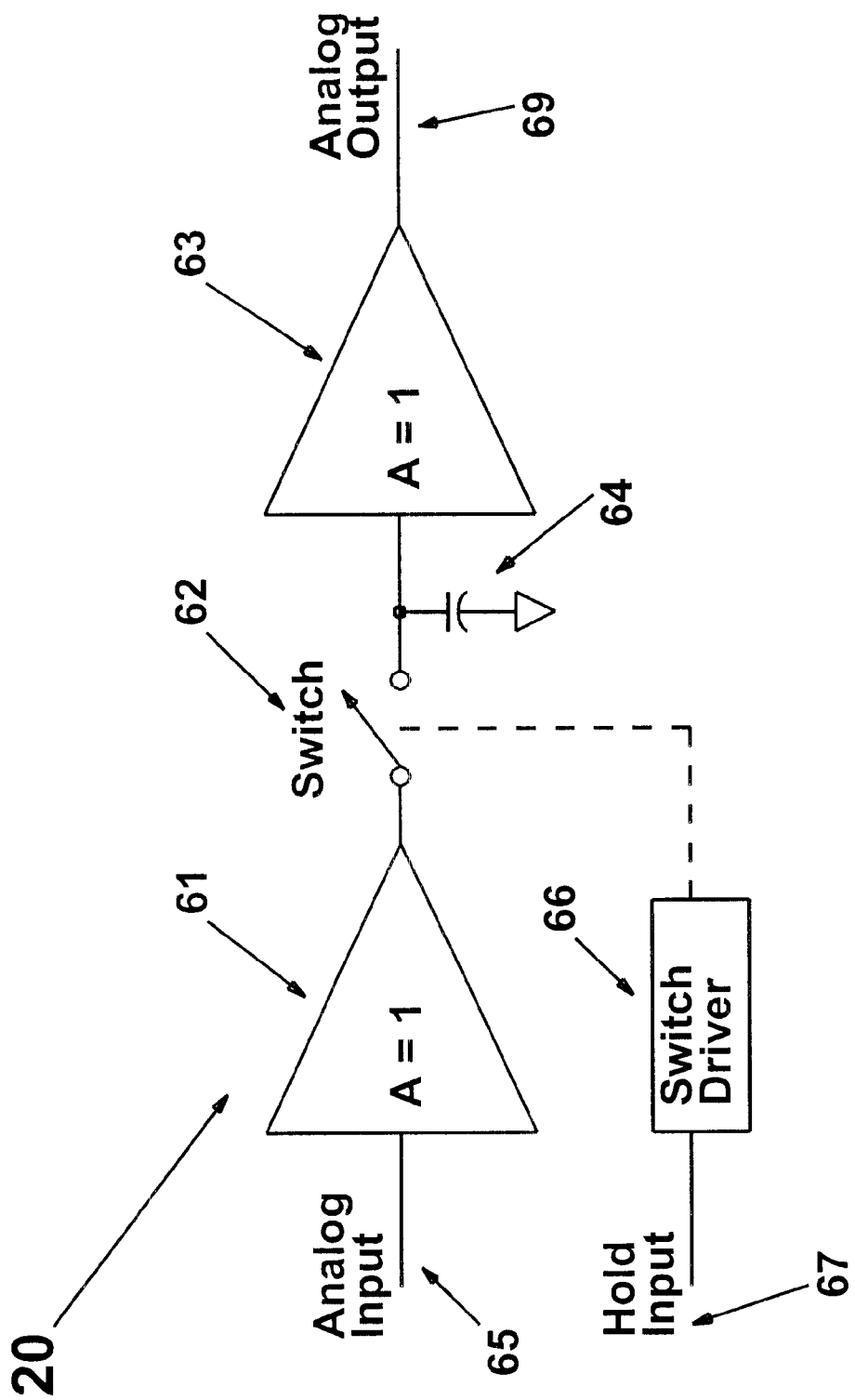
FIG. 6 illustrates an example of a basic track-and-hold (T/H) amplifier circuit.

FIG. 6 illustrates an example of a track-and-hold (T/H) amplifier circuit 20, having two unity gain buffers 61 and 63. Buffer 61 receives an analog input, possibly of sinusoidal form, at its input terminal 65. An essentially identical signal from the output of buffer 61 is applied through series switch 62 to hold capacitor 64. Switch 62 is activated by switch driver circuit 66, which receives a hold input signal, usually in the form of a square wave, at its input 67. Whatever analog value is present at the moment switch 62 is opened (turned off) will be held fixed on capacitor 64. This held value is further buffered by buffer 63 which presents its output at 69.

Figure 7:
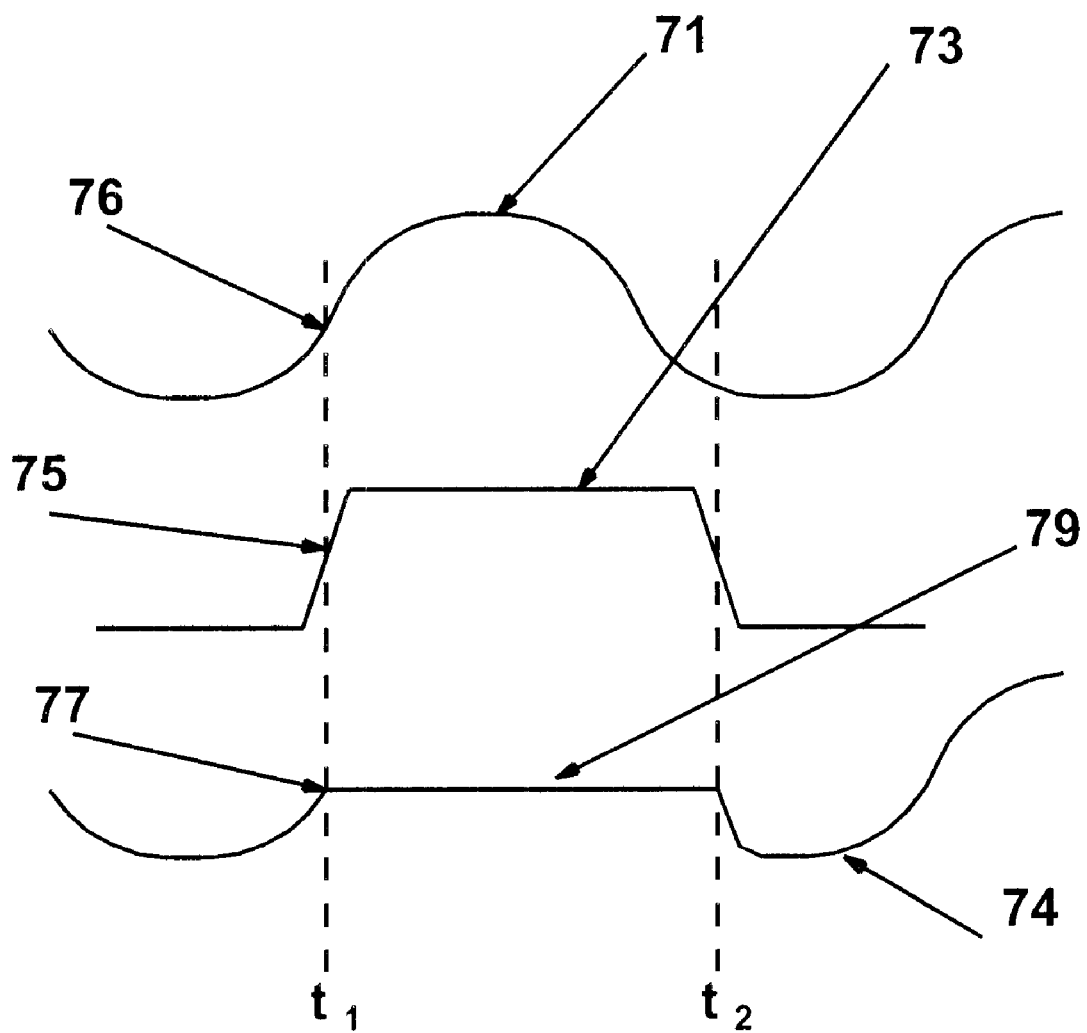
FIG. 7 illustrates a timing diagram showing time delay measurement using T/H of FIG. 6.

FIG. 7 is a timing diagram illustrating input signal 71 which is applied to analog input terminal 65 in FIG. 6 and signal 73 which is applied to hold input terminal 67. The switch driver block 66 is activated by rising edge 75 at time $t_1$ opening switch 62 and at time $t_2$ closing switch 62. Waveform 74 appears at the analog output 69. At time $t_1$ the analog output is held at a substantially-constant level 79 which is equal to the value of the analog input at time $t_1$. The analog output 74 returns to tracking the analog input 71 at time $t_2$. The constant level 79 is a measure of the relative phase of input 71 with respect to input 73.

If the propagation time through buffer 61 is different than the propagation time through switch driver 66, practical timing difficulties may arise. In the example of FIG. 7 a condition where the delay through buffer 61 is greater than that through switch driver 66 can result in a constant signal value 79 being less than the ideal value if both delays were equal. Conversely, a higher than ideal signal value 79 can result if the delay of buffer 61 was less than that through switch driver 66. Such differences in the signal value 79 may result in offset errors in the measurement of the relative phase of the two signals.

Figure 8:
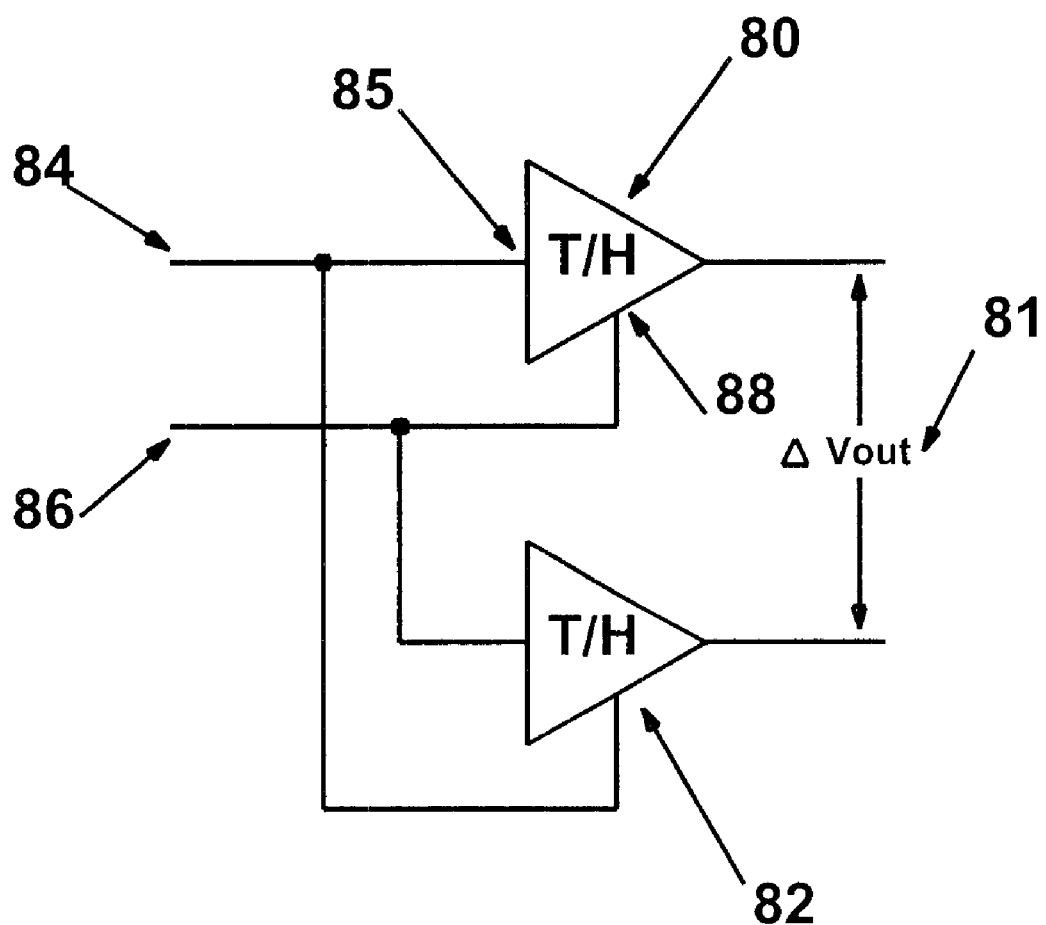
FIG. 8 illustrates an exemplary differential sampling circuit that comprises a set of two T/H circuits as in FIG. 6.

FIG. 8 illustrates a configuration where two identical T/H circuits from FIG. 6 have their inputs cross-connected. The output is the difference between the two T/H outputs shown as ΔVout 81. One aspect of the embodiment of FIG. 8 is that it compensates for possible errors created by an asymmetry in the characteristics of the two inputs (e.g., 85, 88) of a T/H circuit (e.g., 80). This asymmetry or bias can lead to a non-ideal result where a zero phase difference at the input of a T/H circuit causes a non-zero voltage output in embodiments using only one T/H circuit (e.g., FIG. 6). Hence, using two T/H circuits can compensate for this bias because the voltage difference 81, taken between the outputs of the two T/H circuits 80, 82, removes such bias error from the result. As before, the output voltage 81 can be considered an error signal that results from taking the potential difference between the outputs of the T/H circuits 80, 82, and corresponds to the phase difference between input signals 84 and 86.

Figure 9:
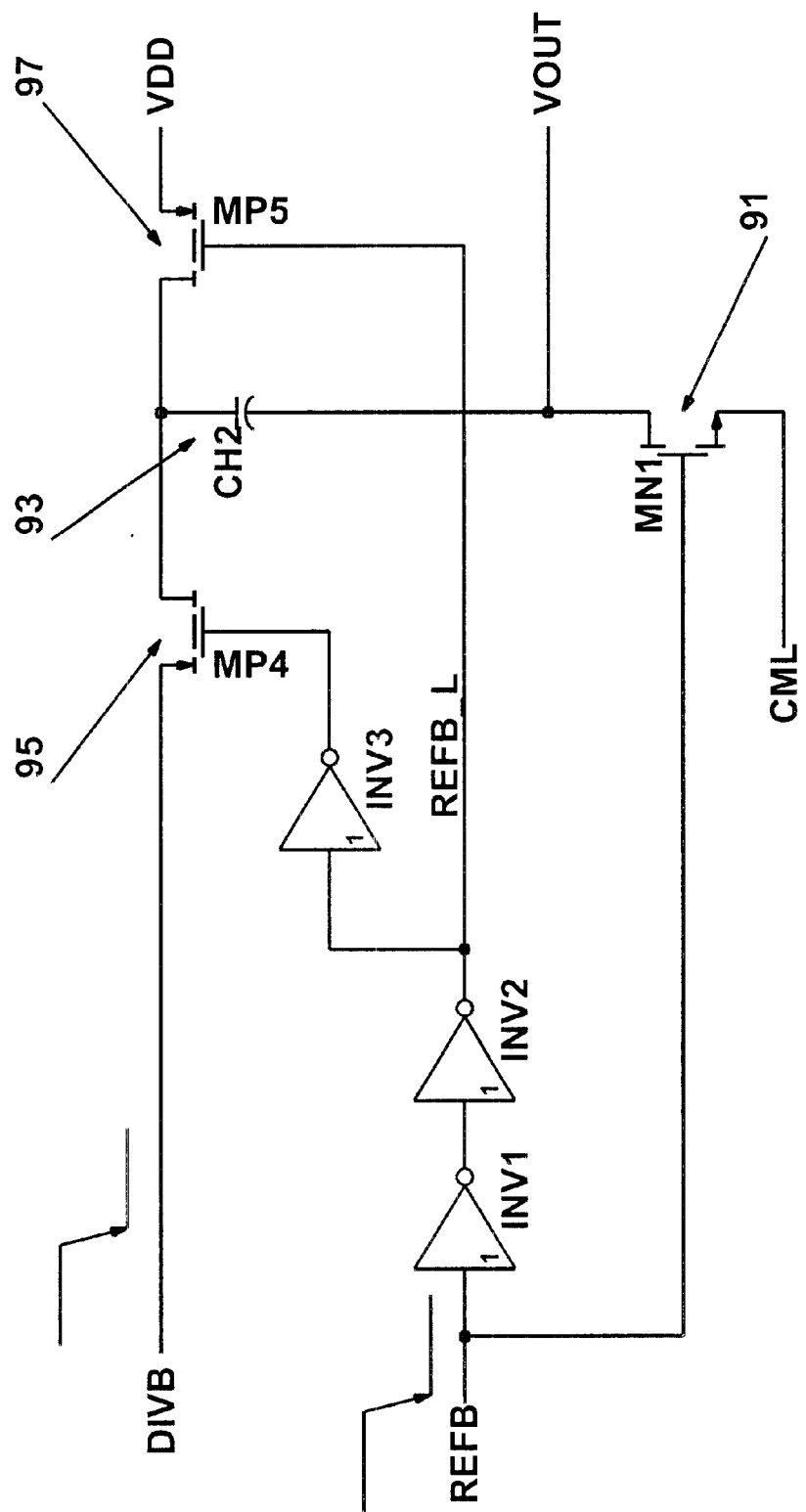
FIG. 9 illustrates an exemplary circuit using a sample-and-hold circuit to sample one of two input signals.

FIG. 9 illustrates an exemplary circuit using a sample-and-hold (S/H) to sample one of two input signals. A first input signal REFB is connected to the gate of a metal oxide semiconductor (MOS) sampling switch 91 and drives the sampling switch 91 to sample a second input signal DIVB onto a hold capacitor 93. Both input signals, REFB and DIVB, may be digital input signals.

Sampling switch 91 may be a metal oxide semiconductor field effect transistor (MOSFET). Sampling switch 91 is normally closed. MOSFET (PMOS) switch 95 is normally closed, and MOSFET (PMOS) switch 97 is normally open. If sampling switch 91 is a n-channel MOSFET (NMOS) then the sampling occurs on the falling edge of signal REFB and the sampled value on the hold capacitor 93 would be higher than some threshold value, corresponding to a zero time difference, if the second input signal DIVB was late with respect to the first input signal REFB. Conversely, the sampled value on capacitor 93 would be lower than the threshold value if the second input signal DIVB was early with respect to the first input signal REFB. The exact point in the falling edge of input signal REFB at which the sampling takes place is determined by the value of a threshold voltage of switch 91 and by the value of voltage CML (common mode level), which is a reference voltage.

Inverters INV1, INV2 and INV3 are used as delay elements. The delay elements produce delayed versions of signal REFB, which are used to disconnect the top of the hold capacitor 93 from signal DIVB and connect it to supply reference terminal VDD. The value of the potential on hold capacitor 93 is taken at terminal VOUT with respect to potential VDD. This is a single-ended approach. In this approach it is sometimes difficult to predict the critical threshold value that will actuate an event at the falling edge of a signal. This is especially so if the falling edges of DIVB and REFB are very close to one another, as described earlier. Additionally, such an analog signal value would drift, depending on process parameters, temperature and other environmental factors. One solution to this problem is to perform the sampling in a differential fashion, as will be described below with respect to some embodiments of the present invention.

Figure 10:
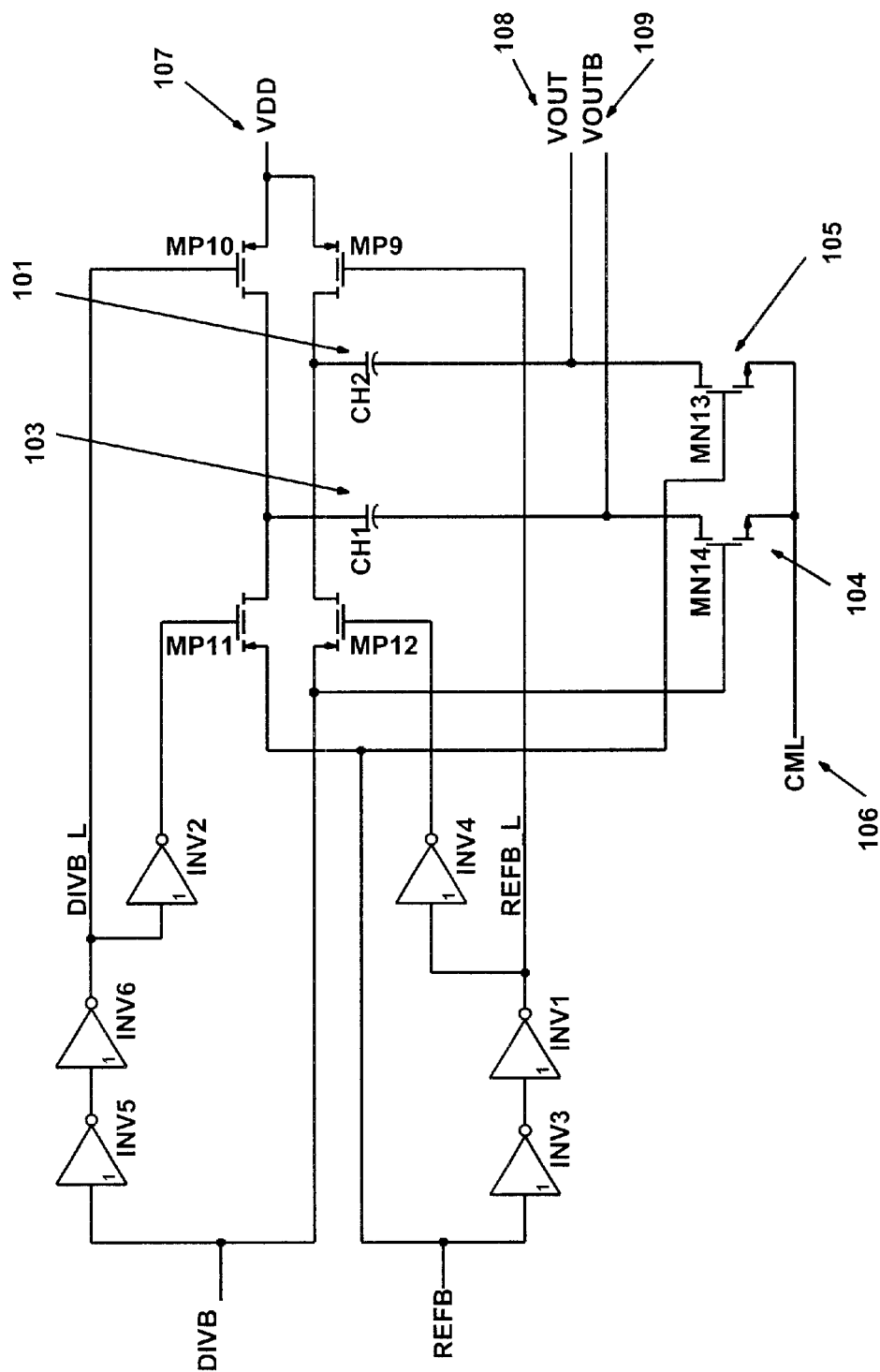
FIG. 10 illustrates an exemplary differential sampling circuit that comprises a set of two sampling circuits as in FIG. 9.

FIG. 10 illustrates an exemplary differential sampling embodiment that comprises a set of two single-ended sampling circuits of FIG. 9. In FIG. 10 a first sample-and-hold (S/H) circuit is formed of CMOS inverters INV5, INV6 and INV2, coupled to digital input DIVB, sampling switch 104 and hold capacitor 103. A second S/H circuit is formed of CMOS inverters INV3, INV1 and INV4, coupled to digital signal REFB, sampling switch 105 and hold capacitor 101. Both S/H circuits share a common input sampling threshold setpoint CML 106 and common output reference level VDD 107. The output is take as the difference between terminals VOUT 108 and VOUTB 109.

As explained earlier with respect to FIG. 9, the voltage on the first S/H terminal VOUT will be higher than some critical value if DIVB was late with respect to the first input signal REFB. Because the inputs for the second S/H are interchanged with respect to the first S/H, the voltage on: the second S/H terminal VOUTB will be lower than the critical value if DIVB was late with respect to the first input signal REFB. As the time difference between REFB and DJVB approaches zero the difference in voltage between VOUT and VOUTB also approaches zero, the critical voltage being common to both outputs. The critical voltage is determined in part by the common mode level (CML) and can be adjusted to maintain the common mode analog output levels on VOUT and VOUTB within an input common mode range of subsequent stages that might follow such as a voltage-to-current (V-I) stage.

The edge rate, described previously, determines the time-to-voltage conversion factor or gain of the circuit of FIG. 10. The higher the rate of change (dV/dt) of the falling edges of the digital input signals REFB and DIVB, the larger the corresponding differential voltage appearing at VOUT 108 and VOUTB 109 resulting from a given time or phase difference between REFB and DIVB. This conversion factor or gain is often specified in mV/pSec.

Some aspects of the invention, discussed below, use chopping circuits and the input and/or output of the S/H circuit of FIG. 10 to remove offset errors due to unavoidable differences between circuit elements within the S/H from the system by time averaging out these errors. Other aspects of the invention, discussed below, append a V-to-I stage (voltage to current converter) to the output of the S/H circuit of FIG. 10, at VOUT and VOUTB. Both the chopping and the V-to-I circuits can be used together in the same overall circuit according to some embodiments. Also, the chopping circuits and the V-to-I stage, discussed below, may be implemented as part of a separate circuit, coupled to the S/H, according to other embodiments.

Figure 11:
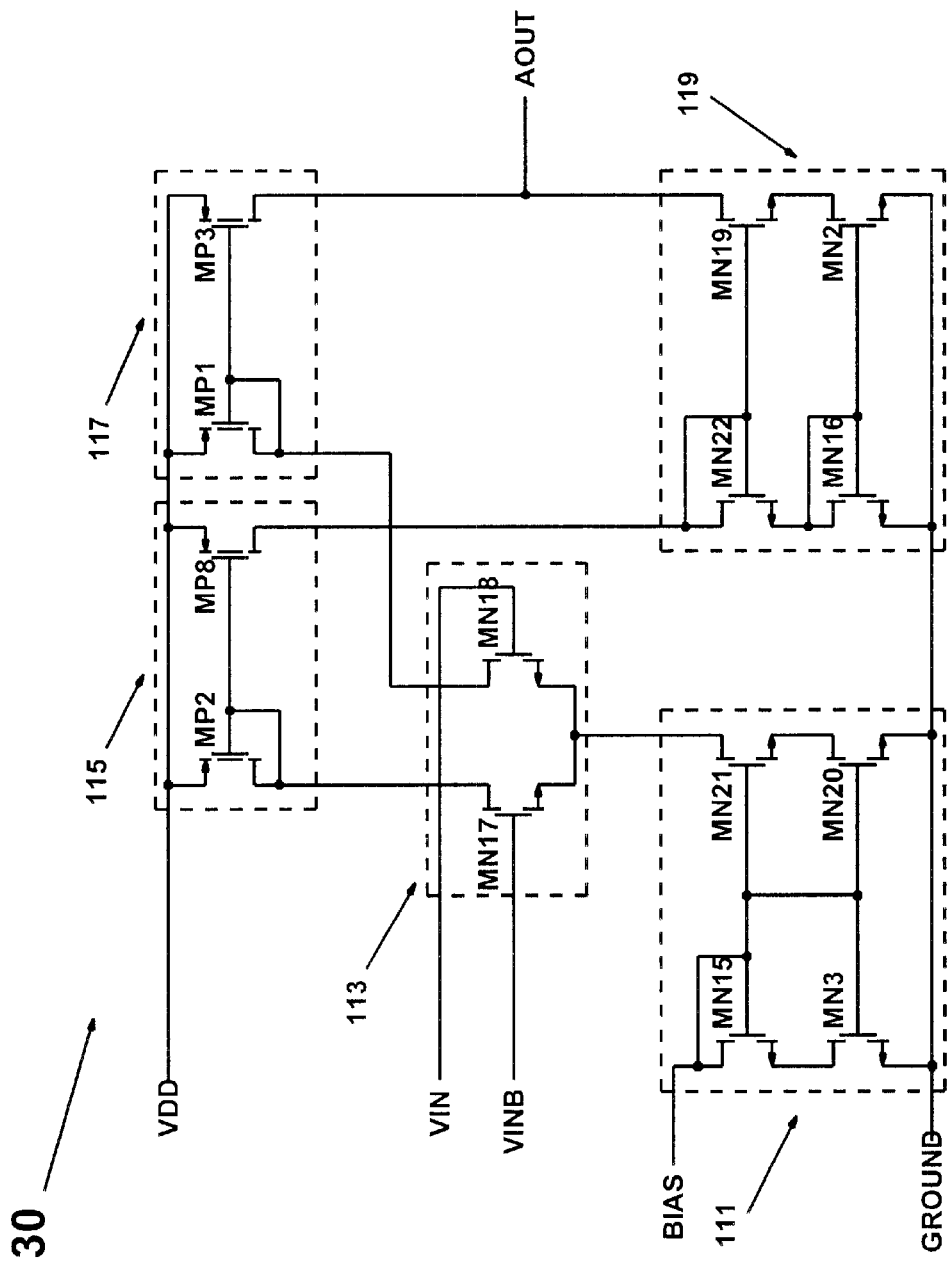
FIG. 11 illustrates an exemplary embodiment of a voltage-to-current conversion stage.

FIG. 11 illustrates an exemplary voltage-to-current (V-I) conversion stage 30 that converts error voltage signals VIN and VINB to a current output signal AOUT. A current mirror 111, consisting of four NMOS transistors, provides a tail current, to an differential pair of NMOS transistors 113. The differential pair 113 provide a differential current to two PMOS current mirrors 115 and 117. The output of PMOS mirror 115 is connected to the input side of NMOS current mirror 119. The output of PMOS mirror 117 is connected to the output AOUT and the output side of NMOS mirror 119.

When the voltage applied to VIN equals that applied to VINB the tail current from current mirror 111 is divided evenly between the two PMOS current mirrors 115 and 117. The output of mirror 115 is reflected through mirror 119 and summed with the output of mirror 117. In the above case where the two input voltages are equal, the net difference between the two currents summed at AOUT will be zero and no current will flow into or out of any additional circuits connected to AOUT. If the voltage applied to VIN is more positive than that applied to VINB a larger fraction of the tail current will flow in that side of differential pair 113 and thus the current flowing in mirror 117 will be larger than the current flowing in mirror 115. In this case the two currents will not sum to zero in output AOUT and the net difference in the currents will flow into whatever additional circuit is connected to AOUT. It can be seen from the above examples that the opposite will occur if the voltage applied to VIN is more negative than VINB. The circuit of FIG. 11 could have offset errors due to differences between circuit elements. In some embodiments, auto-zeroing or chopping techniques are employed to remove such errors. "Commutating" is sometimes referred to as "chopping" or "swapping."

A bi-directional single-ended current flows out of AOUT into a loop filter capacitor (not shown but similar to 18 in FIG. 1). Thus the circuit of FIG. 11 combined with that of FIG. 10 performs substantially as a phase detector and charge pump (16 in FIG. 1).

Figure 12:
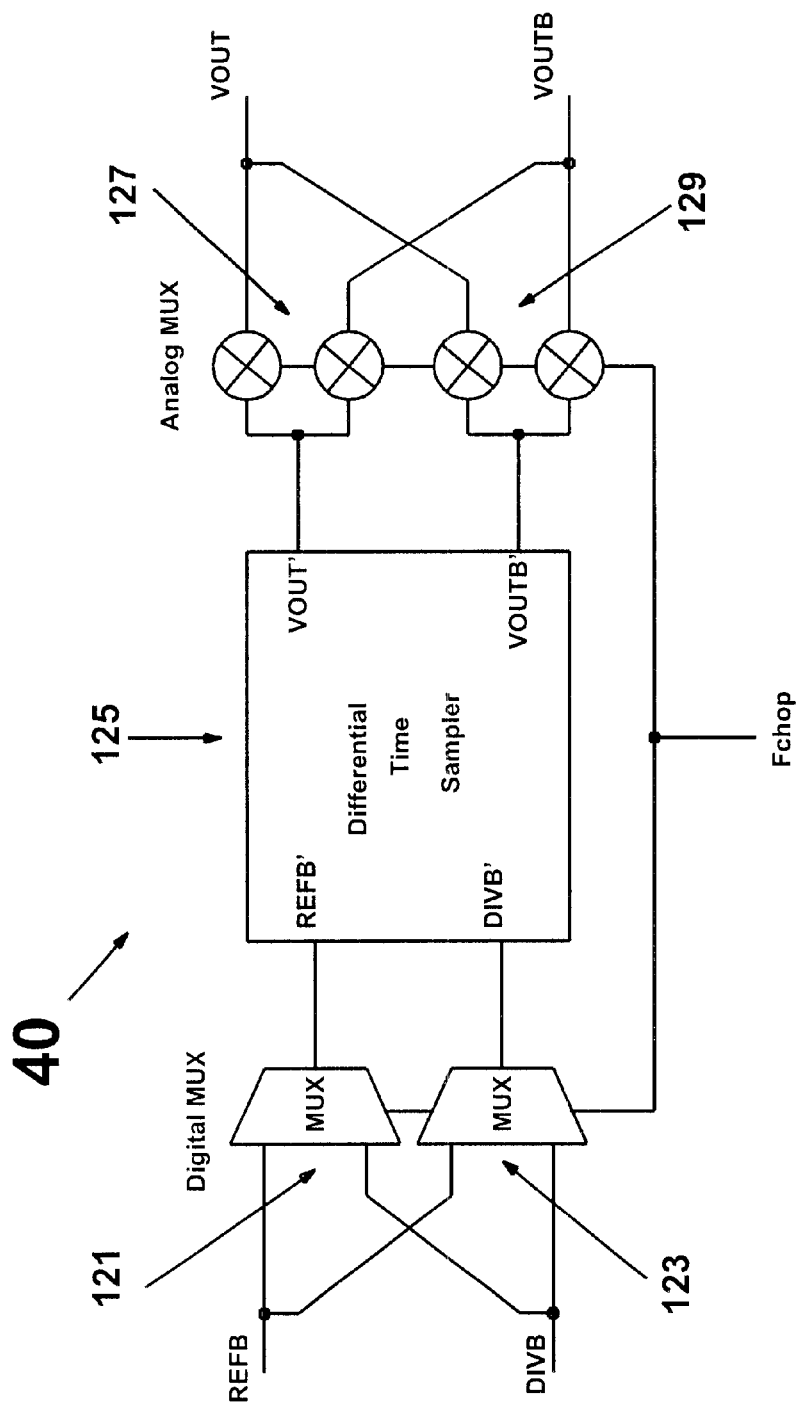
FIG. 12 illustrates a commutating differential time sampling system using differential sampling circuit as in FIG. 10.

FIG. 12 illustrates a commutating differential time sampling system 40. The system comprises digital input Signals REFB and DIVB, each being input to digital multiplexers (MUX) 121, 123 to allow for alternate sampling and referencing of the input digital signals. As discussed previously, alternate sampling and referencing of the input signals removes offset errors that would otherwise occur from differences between circuit elements. The digital muitiplexers 121, 123 are actuated by signal Fchop and provide outputs REFB' and DIVB' respectively to differential time sampler 125.

Differential time sampler 125 functions as described above with respect to FIG. 10 for example, and provides analog outputs VOUT' and VOUTB' to analog multiplexers 127 and 129. Analog multiplexers 127 and 129 are actuated by signal Fchop and act to "decominutate" the commutation done by digital multiplexers 121 and 123. The overall effect is to average out or remove the effect of mismatches in the signal paths of REFB' and DIVB', thus making the potential difference at the output of the system 40 proportional to the phase difference at the input of the system 40.

In some embodiments, the two inputs REFB and DIVB have similar or matched dV/dt characteristics. However, this is not required for operation of the system 40.

A number of methods to realize the digital multiplexers may be implemented. Some methods to construct multiplexers utilize, but are not limited to, gated inverters, NAND gates, or transmission gates.

It should be understood that various embodiments of the present invention are capable of removing errors generated by the asymmetry between two inputs of a given S/H circuit, as described above by using input cross-hardwiring of the inputs to two S/H circuits. However, if suitable, the present invention encompasses embodiments using a single S/H circuit coupled to an input commutator as well, which avoids errors resulting from using two non-identical S/H circuits.

Figure 13:
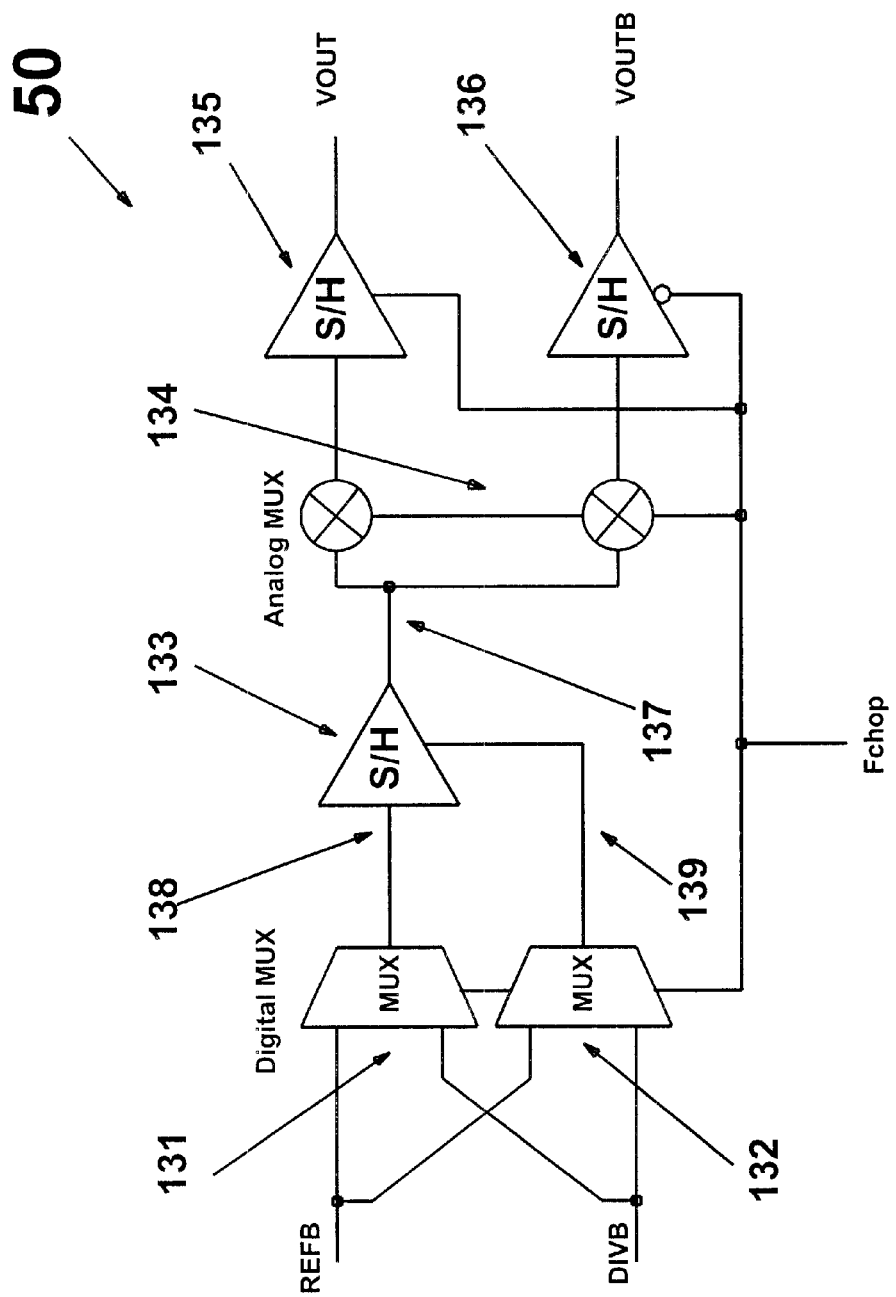
FIG. 13 illustrates a commutating differential time sampling system using a single sample-and-hold circuit as in FIG. 9.

FIG. 13 illustrates an embodiment of the present invention 50 that removes both the error due to asymmetrical S/H inputs as well as errors resulting from the use of non-identical S/H circuits. The embodiment of FIG. 13 uses two digital input multiplexers 131, 132 to alternately provide two input signals REFB and DIVB to the two inputs of S/H circuit 131. The output of S/H circuit 131 is an interleaved signal having two time-interleaved components sent to line 137. An output 137 of the S/H circuit is provided to an analog multiplexer (MUX) 134. The analog MUX 134 provides outputs to two separate S/H circuits 135 and 136. This arrangement of analog MUX 135 and the two S/H circuits 135, 136, substitutes in part for the decommutator described earlier in previously-discussed embodiments. The S/H circuits 135, 136 provide output voltages VOUT, VOUTB, the difference between which is indicative of a time difference or phase difference between input signals REFB and DIVB. The analog MUX 134 can be coupled to one of the inputs as a control signal Fchop, the coupling being to control the switching frequency of the MUXs 131, 132, 134. Depending on the implementation of this embodiment, it can be seen that sometimes extra hardware is traded off for increased speed in phase difference measurement.

At least two ways of commutating the input to the embodiment in FIG. 13 are possible. First, it is possible to commutate the two input signals REFB and DIVB to alternately provide input signals to both of the inputs of S/H circuit 131, as discussed previously. Second, it is possible to lock MUX 131 is such a configuration to always provide input REFB signal to the first S/H 131 input at 138 and alternately provide the first and second input signals REFB, and DIVB to the second S/H 133 input at 139. On alternating cycles REFB is used to sample itself, which in effect measures the difference in propagation delay of S/H inputs 138 and 139, and uses DIVB to sample REFB, which measures the time difference between REFB and DIVB but includes the same systematic offset measured in the alternate cycle. By subtracting these two values, the actual time difference can be obtained free of any offset errors.

While only certain preferred embodiments and features of the invention have been illustrated and described herein, many modifications and changes will occur to those skilled in the art. It is, therefore, to be understood that the appended claims are intended to cover all such modifications and changes as fall within the range of equivalents and understanding of the invention.

What is claimed is:

1. A differential sampling circuit, comprising:
   a commutator having at least two inputs that receive a respective first input signal and a second input signal, said commutator having at least a first output and a second output, the first commutator output alternately providing said first and second input signals and the second commutator output alternately providing said second and first input signals, respectively;
   a sample-and-hold circuit that alternately samples the second commutator output using the first commutator output as a reference, and samples the first commutator output using the second commutator output as a reference, and that provides an interleaved error signal; and a decommutator that receives said interleaved error signal and provides at least two de-interleaved output signals indicative of a time difference between said first and second input signals; wherein the commutator and the decommutator are complimentary and perform substantially inverse operations.

2. The circuit of claim 1, wherein the first and second input signals have matched characteristics.

3. The circuit of claim 2, wherein the characteristics relate said time difference to a corresponding potential difference.

4. The circuit of claim 1, wherein the first and second input signals comprise digital input signals.

5. The circuit of claim 1, wherein the first and second input signals comprise square waves.

6. The circuit of claim 1, wherein the decommutator comprises a multiplexer followed by a pair of sample-and-hold circuits each of which receives an output from the multiplexer.

7. The circuit of claim 1, further comprising a voltage-to-current converter that provides a current signal indicative of said time difference.

8. The circuit of claim 7, further comprising an integrator that integrates the current signal and provides an integrated signal.

9. The circuit of claim 8, further comprising a control circuit that receives the integrated signal and provides a control signal.

10. The circuit of claim 9, wherein the control circuit controls any of a delay, a phase and a frequency of a controlled signal using said control signal.

11. The circuit of claim 9, wherein the control circuit comprises a voltage-controlled oscillator.

12. The circuit of claim 9, wherein the control circuit comprises a voltage-controlled delay element.

13. A method for determining a time difference between at least a first input signal and a second input signal, comprising:

commutating the first and second input signals to alternately provide the first and second input signals at first and second commutator outputs;

alternately sampling the first commutator output using the second commutator output as a reference and sampling the second commutator output using the first commutator output as a reference;

generating an interleaved error signal from the first and second commutator outputs; and de-interleaving said error signal to provide at least two de-interleaved output signals indicative of a time difference between the first and second input signals.

14. The method of claim 13, further comprising holding the sampled commutator outputs.

15. The method of claim 13, further comprising converting the de-interleaved output signals from a voltage to a current.

16. The method of claim 15, further comprising integrating said current to provide an integrated signal.

17. The method of claim 16, further comprising generating a control signal from said integrated signal.

18. The method of claim 17, further comprising controlling a voltage-controlled oscillator using said control signal.

19. The method of claim 17, further comprising controlling a voltage-controlled delay element using said control signal.

20. The method of claim 13, wherein de-interleaving said error signal comprises multiplexing said error signal and providing a first multiplexed signal and a second multiplexed signal to respective first and second sampling circuits.

21. A differential sampling circuit, comprising:

an input network, said input network comprising a first input line and a second input line, each of said first and second input lines being cross-hard wired to provide a pair of respective first and second input signals;

a first sampling circuit and a second sampling circuit, each of said first and second sampling circuits receiving said pair of first and second input signals from the cross-hard wired input lines, said first and second sampling circuits each providing an output voltage; and an error signal, corresponding to a phase difference between said first and second input signals, said error signal representing a potential difference between said first and second sampling circuit outputs.

22. The circuit of claim 21, wherein the error signal corresponds to a time delay between said first and second input signals.

* * * * *